US008809874B2

(12) United States Patent
Chang

(10) Patent No.: US 8,809,874 B2
(45) Date of Patent: Aug. 19, 2014

(54) LIGHT EMITTING DIODE AND LIGHT EMITTING DEVICE

(75) Inventor: Richard Rugin Chang, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 13/129,385

(22) PCT Filed: Dec. 31, 2010

(86) PCT No.: PCT/CN2010/080654
§ 371 (c)(1),
(2), (4) Date: May 13, 2011

(87) PCT Pub. No.: WO2012/062017
PCT Pub. Date: May 18, 2012

(65) Prior Publication Data
US 2013/0214309 A1    Aug. 22, 2013

(30) Foreign Application Priority Data
Nov. 9, 2010 (CN) .......................... 2010 1 0538397

(51) Int. Cl.
*H01L 27/15* (2006.01)
*H01L 31/12* (2006.01)
*H01L 33/00* (2010.01)
*H01L 33/38* (2010.01)
*H01L 33/20* (2010.01)

(52) U.S. Cl.
CPC ............... *H01L 33/387* (2013.01); *H01L 33/20* (2013.01); *H01L 33/382* (2013.01)
USPC .. 257/79; 257/98; 257/E33.001; 257/E31.127

(58) Field of Classification Search
USPC ................... 257/79, 80, 81, 95, 98, E33.001, 257/E31.127
See application file for complete search history.

(56) References Cited

U.S. PATENT DOCUMENTS 7,520,644 B2    4/2009  Jordan et al.
7,851,817 B2   12/2010  Yasuda et al.
(Continued)

FOREIGN PATENT DOCUMENTS

CN    1858918 A    11/2006
CN    1860620 A    11/2006
(Continued)

OTHER PUBLICATIONS

Extended European Search Report issued by the European Patent Office, Rijswijk, NL, dated May 3, 2013, for European Application No. 10827694.0; 6 pages.
(Continued)

*Primary Examiner* — Hoai V Pham
(74) *Attorney, Agent, or Firm* — Faegre Baker Daniels LLP

(57) ABSTRACT

The present invention provides an LED and the manufacturing method thereof, and a light emitting device. The LED includes a first electrode, for connecting the LED to a negative terminal of a power supply; a substrate, located on the first electrode; and an LED chip, located on the substrate; in which a plurality of contact holes are formed through the substrate, the contact holes are evenly distributed and filled with electrode plugs connecting the first electrode to the LED chip. The light emitting device includes the LED, and further includes a base and an LED mounted on the base. The manufacturing method includes: providing a substrate; forming on the substrate an LED chip and a second electrode successively; forming a plurality of evenly distributed contact holes on a backface of the substrate, the contact holes extending through the substrate and to the LED chip; and filling the contact holes with conducting material till the backface of the substrate is covered by the conducting material. The LED has a high luminous efficiency and the manufacturing method is easy to implement.

8 Claims, 6 Drawing Sheets

(56) References Cited

U.S. PATENT DOCUMENTS

| | | | |
|---|---|---|---|
| 2002/0074556 A1 | 6/2002 | Kwak et al. | |
| 2002/0117681 A1 | 8/2002 | Weeks et al. | |
| 2002/0139990 A1 | 10/2002 | Suehiro et al. | |
| 2004/0173810 A1 | 9/2004 | Lin et al. | |
| 2004/0217361 A1 | 11/2004 | Negley | |
| 2005/0211997 A1 | 9/2005 | Suehiro et al. | |
| 2006/0102925 A1 | 5/2006 | Liu et al. | |
| 2006/0163596 A1* | 7/2006 | Kim et al. | 257/98 |
| 2007/0200128 A1 | 8/2007 | Yano | |
| 2008/0296595 A1 | 12/2008 | Chu | |
| 2009/0272994 A1 | 11/2009 | Lim | |
| 2010/0079050 A1 | 4/2010 | Kamamori et al. | |
| 2010/0123162 A1 | 5/2010 | Kondo et al. | |
| 2010/0244083 A1* | 9/2010 | Kim | 257/99 |
| 2011/0108800 A1 | 5/2011 | Pan | |
| 2013/0193406 A1* | 8/2013 | Xiao et al. | 257/13 |

FOREIGN PATENT DOCUMENTS

| | | |
|---|---|---|
| CN | 101132041 A | 2/2008 |
| CN | 201044245 Y | 4/2008 |
| CN | 201307601 Y | 9/2009 |
| CN | 101615646 A | 12/2009 |
| CN | 101714596 A | 5/2010 |
| EP | 1 460 694 | 9/2004 |
| EP | 1670073 A1 | 6/2006 |
| JP | 2008060330 A | 3/2008 |

OTHER PUBLICATIONS

International Search Report and Written Opinion (in Chinese), issued by the State Intellectual Property Office, Beijing, China, dated Aug. 11, 2011, for related International PCT Application No. PCT/CN2010/080654; 10 pages.

English Translation of the International Search Report; ISA—The State Intellectual Property Office, Beijing, China, dated Aug. 11, 2011, for related International PCT Application No. PCT/CN2010/080654; 2 pages.

Extended European Search Report issued by the European Patent Office, Rijswijk, NL, dated Oct. 9, 2013, for European Patent Application No. 10829323.4; 7 pages.

English Translation of the Written Opinion, the State Intellectual Property Office, Beijing, China, dated Aug. 8, 2011, for International PCT Application No. PCT/CN2010/080652; 5 pages.

International Preliminary Report on Patentability (Chinese language), The International Bureau of WIPO, Geneva, Switzerland, dated May 14, 2013, for International PCT Application No. PCT/CN2010/080652; 6 pages.

English Translation of the International Preliminary Report on Patentability, The International Bureau of WIPO, Geneva, Switzerland, dated May 14, 2013, for International PCT Application No. PCT/CN2010/080652; 6 pages.

English Translation of the Written Opinion, the State Intellectual Property Office, Beijing, China, dated Aug. 1, 2011, for International PCT Application No. PCT/CN2010/080654; 3 pages.

International Preliminary Report on Patentability (Chinese language), The International Bureau of WIPO, Geneva, Switzerland, dated May 14, 2013, for International PCT Application No. PCT/CN2010/080654; 4 pages.

English Translation of the International Preliminary Report on Patentability, The International Bureau of WIPO, Geneva, Switzerland, dated May 14, 2013, for International PCT Application No. PCT/CN2010/080654; 4 pages.

International Search Report and Written Opinion (in Chinese), issued by the State Intellectual Property Office, Beijing, China, dated Aug. 18, 2011, for related International PCT Application No. PCT/CN2010/080652; 13 pages.

English Translation of the International Search Report; ISA—The State Intellectual Property Office, Beijing, China, dated Aug. 11, 2011, for related International PCT Application No. PCT/CN2010/080652; 6 pages.

* cited by examiner

LIGHT EMITTING DIODE AND LIGHT EMITTING DEVICE

The present application claims the priority of Chinese Patent Application No. 201010538397.1, entitled "Light Emitting Diode and Manufacturing Method thereof, Light Emitting Device", and filed Nov. 9, 2010, the entire disclosure of which is incorporated herein by reference.

FIELD OF INVENTION

The present invention relates to the semiconductor field, and particularly relates to a light emitting diode and manufacturing method thereof and light emitting device.

BACKGROUND OF THE INVENTION

A light emitting diode (LED) is a semiconductor device, which emits different colored light driven by current. Semiconductor material consisting of a compound of the III-V family such as gallium nitride (GaN) has attracted widespread attention because of its wide bandgap, high luminous efficiency, high saturated electron drift velocity, high chemical stability, and huge potential in high brightness blue LED, blue lasers and other optoelectronic fields.

However, conventional LED devices have a problem of low luminous efficiency, which are only several percentage points before LED packaging. A large amount of energy is wasted inside LED devices, causing both energy waste and shorter service life. Therefore, improving the luminous efficiency is very important for LED devices.

Based on the above requirements, many ways of improving the luminous efficiency of LED have been applied to the LED device structure, such as the surface roughening method, metal reflecting mirror structure, etc. In a Chinese patent application (publication number CN1858918A), an LED with an omnidirectional reflector structure to improve the luminous efficiency is disclosed. However, in the method, a film structure including stacked high refractive index layers and low refractive index layers is required to be formed on a substrate. Therefore, the manufacture process of the method is complex.

SUMMARY OF THE INVENTION

It is an object of this invention to provide an LED with high luminous efficiency.

To achieve the above-mentioned object, according to the first aspect of the present invention, there is provided an LED including: a first electrode, for connecting the LED to a negative terminal of a power supply; a substrate, located on the first electrode; and an LED chip, located on the substrate. A plurality of contact holes are formed through the substrate, the contact holes are evenly distributed and filled with electrode plugs connecting the first electrode to the LED chip.

According to the second aspect of the present invention, there is provided a light emitting device includes an LED and a base, on which the LED is mounted.

According to the third aspect of the present invention, there is provided a method for manufacturing an LED, including: providing a substrate; forming on the substrate an LED chip and a second electrode successively; forming a plurality of evenly distributed contact holes on a backface of the substrate, the contact holes extending through the substrate and to the LED chip; and filling the contact holes with conducting material till the backface of the substrate is covered by the conducting material.

In comparison with conventional technologies, the present invention has the following advantages:

1. The contact holes formed on the backface of the substrate electrically connect the n-type GaN semiconductor layer, which reduces the current density, thus reducing the auger recombination and improving the internal quantum efficiency of the LED;

2. The side walls of the pyramid-shaped recesses formed on the upper surface of the substrate reflect light emitted form the LED chip to the light-exiting surface of the LED, which increases the area of reflecting surface and improves the luminous efficiency of the LED.

DESCRIPTION OF THE PREFERRED EMBODIMENTS

Hereunder, the present invention will be described in detail with reference to embodiments, in conjunction with the accompanying drawings.

Embodiments to which the present invention is applied are described in detail below. However, the invention is not restricted to the embodiments described below.

As described in the background, in conventional technology, to improve the luminous efficiency of LED, a film structure including stacked high refractive index layers and low refractive index layers is required to be formed on a substrate, which leads to a complex manufacture process.

To solve the above problem, the present invention provides a light emitting device including an LED. The LED includes: a first electrode, for connecting the LED to a negative terminal of a power supply; a substrate and an LED chip successively located on the first electrode. A plurality of contact holes are formed through the substrate, the contact holes are evenly distributed and filled with electrode plugs connecting the first electrode to the LED chip. When the LED emits light, a power supply provides power to the LED chip via the electrode plugs, which reduces the current density and the auger recombination, thus improving the internal quantum efficiency and luminous efficiency of the LED.

Figure 1:
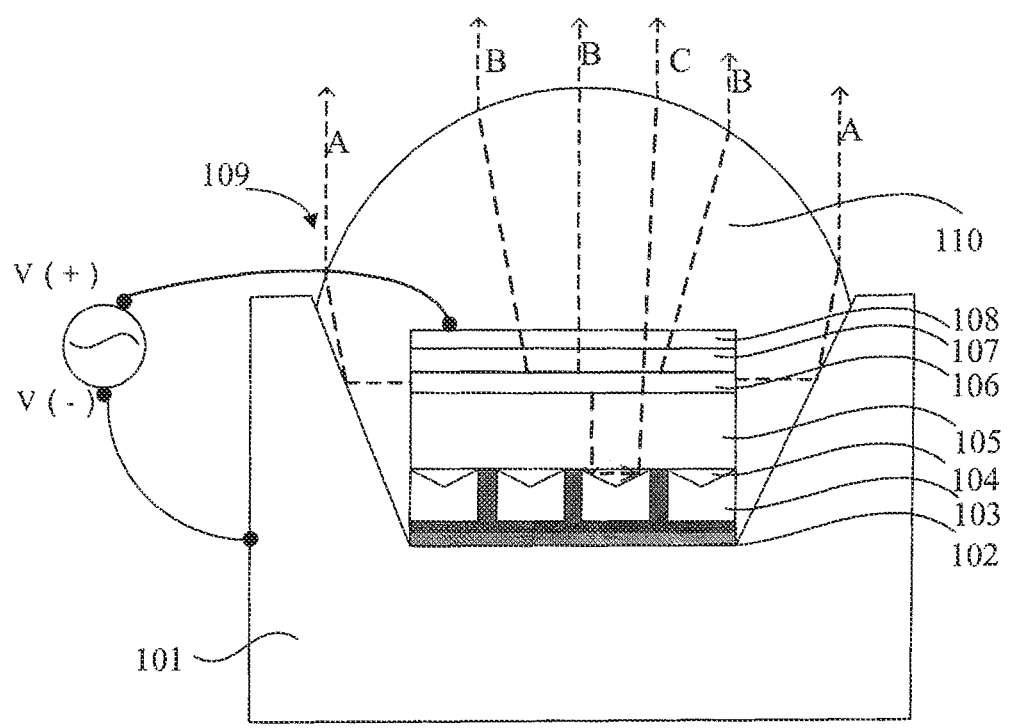
FIG. 1 is a sectional view of an embodiment of the light emitting device of the present invention.

Referring to FIG. 1, a light emitting device of an embodiment is illustrated. The light emitting device includes a base 101 and an LED 109 mounted in the base 101.

The base 101 includes an assembly groove, which is used to hold the LED 109. The side wall of the assembly groove and the bottom of the assembly groove forms an angle θ of 130°~150°. The side wall of the assembly groove reflects light emitted from the LED 109 to the light-exiting surface of the LED 109, which improves the luminous efficiency of the light emitting device.

The base 101 uses conducting material having good heat dispersion characteristics, which can disperse the heat from the LED and electrically connect the LED 109 and the negative terminal of a power supply.

Specifically, the base is made from materials such as silicon or aluminium, etc. The dimension of the upper contact hole of the assembly groove is 4 μm, and the dimension of the bottom contact hole of the assembly groove is 2 μm. The assembly groove has a large upper contact hole and a small bottom contact hole, which guarantees that the angle θ formed by the side wall of the assembly groove and the bottom of the assembly groove is 130°~150° and the side wall of the assembly groove reflects light emitted form LED to light-exiting surface of the light emitting device.

Preferably, the base 101 also connects a first lead, which is used to connect the base 101 to the negative terminal of the power supply.

The LED 109 is positioned in the assembly groove of the base 101. The LED 109 includes: a first electrode 102, a substrate 103 located on the first electrode 102, a LED chip located on the substrate 103, and a second electrode 107 located on the LED chip. A plurality of pyramid-shaped recesses are formed on the upper surface of the substrate 103.

The first electrode 102 is positioned on the bottom of the assembly groove of base 101. The first electrode 102 is used to electrically connect the LED 109 and a negative terminal of the power supply. Specifically, the first electrode 102 is made from conductive metals, such as titanium, aluminum or gold, etc.

A plurality of evenly distributed contact holes are formed in the substrate 103. Electrode plugs are formed in the contact holes, which are used to connect the first electrode 102 below the substrate 103 to the LED chip above the substrate 103. Specifically, the electrode plugs are made from conductive metals, such as titanium, aluminum or gold, etc. Multiple electrode plugs provide the LED chip with multiple current inputs, which reduce the current density and auger recombination, thus improving the internal quantum efficiency and luminous efficiency of the LED.

Preferably, a plurality of pyramid-shaped recesses are formed on the upper surface of the substrate. The side walls of the pyramid-shaped recesses reflect light emitted from the LED chip to the light-exiting surface of the LED, which increases the area of reflecting surface and improves the outer quantum efficiency and luminous efficiency of the LED. Specifically, the substrate 103 is sapphire with a thickness of 20 μm~50 μm. The pyramid-shaped recesses on the upper surface of the substrate have a depth of 0.1 μm~1 μm. Adjacent pyramid-shaped recesses have an interval of 0.1 μm~10 μm. In order to let the substrate 103 have a lattice constant that matches the LED chip, preferably, the pyramid-shaped recesses are filled with a buffer layer 104, and the substrate 103 is sapphire and the buffer layer 104 is aluminium nitride or gallium nitride (GaN).

An n-type semiconductor layer 105, an active layer 106 and a p-type semiconductor layer 107 successively located on the substrate 103 (or on the substrate 103 and the buffer layer 104) constitute the LED chip. The material of the n-type semiconductor layer 105 includes n-type gallium nitride, and the active layer 106 includes multi-quantum well active layer. Specifically, the material of the multi-quantum well active layer includes InGaN, and the material of the p-type semiconductor layer 107 includes p-type gallium nitride.

The second electrode 108 is located on the LED chip, which is used to electrically connect the LED 109 and a positive terminal of the power supply. Specifically, the second electrode 108 is made from conductive metals, such as nickel or gold, etc. Preferably, the second electrode 108 is connected with a second lead; the second lead is used to connect the LED 109 to the positive terminal of the power supply.

Preferably, the light emitting device further includes a lens structure 110, which covers the second electrode 108. The lens structure 110 converges light emitted from the LED 109, which improves the lightness of the light emitting device. Preferably, the lens structure 110 fills the gap between the LED 109 and the base 101. Specifically, the lens structure 110 converges the light emitted from the LED (shown as light path B), the light emitted from the LED and reflected by the side wall of the base (shown as light path A), and the light emitted from the LED chip and reflected by the side walls of the pyramid-shaped recesses (shown as light path C), thus improving the lightness of the light emitting device.

The light emitting device further includes fluorescent powder (now shown) covering the lens structure, which is used for emitting white light. Specifically, for blue-light LED, the fluorescent powder is YAG fluorescent powder including $Ce^{3+}$.

Figure 2:
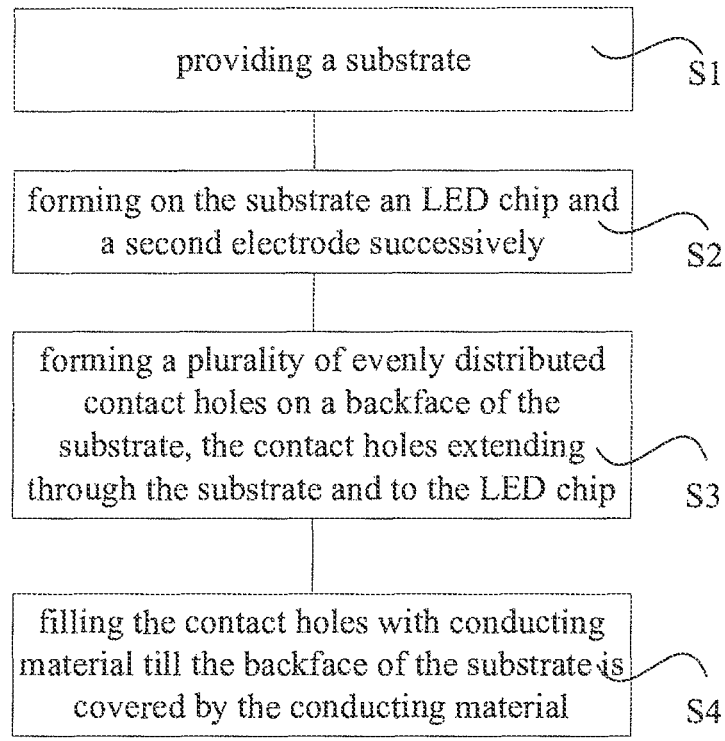
FIG. 2 is a flow diagram of an embodiment of the method for manufacturing an LED in the present invention.

There is also provided a method for manufacturing an LED in the present invention. FIG. 2 is a flow diagram of an embodiment of the method for manufacturing an LED. The method includes:

S1, providing a substrate;

S2, forming on the substrate an LED chip and a second electrode successively;

S3, forming a plurality of evenly distributed contact holes on a backface of the substrate, the contact holes extending through the substrate and to the LED chip;

S4, filling the contact holes with conducting material till the backface of the substrate is covered by the conducting material.

FIG. 3 to FIG. 8 are sectional views of an embodiment of an LED formed by the method for manufacturing an LED in the present invention; each step is described below in more detail in conjunction with the accompanying drawings.

In step S1, specifically, the substrate is sapphire, the surface of the substrate which is used to form the LED is the upper surface, and the other surface of the substrate is the backface.

To improve the luminous efficiency of the LED, in a preferable embodiment, a plurality of pyramid-shaped recesses are formed on the upper surface of the substrate. The side walls of the pyramid-shaped recesses reflect light emitted from the LED chip to the light-exiting surface of the LED.

Figure 9:
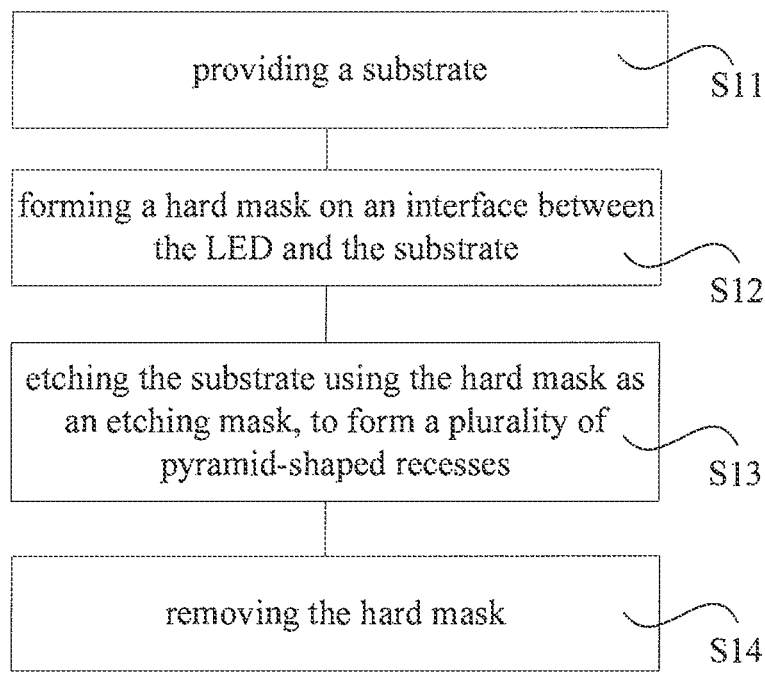
FIG. 9 is a flow diagram of an embodiment of the step S1 in FIG. 2.

Referring to FIG. 9, which is a flow diagram of a preferable embodiment of the step S1 in FIG. 2, S1 includes:

S11, providing a substrate;

S12, forming a hard mask on an interface between the LED and the substrate;

S13, etching the substrate using the hard mask as an etching mask, to form a plurality of pyramid-shaped recesses;

S14, removing the hard mask.

Figure 3:
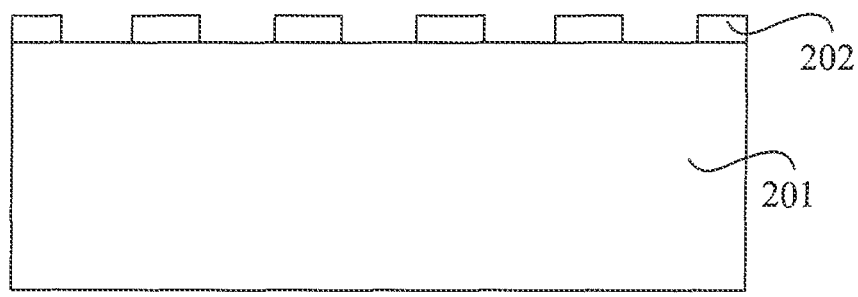
FIG. 3 to FIG. 8 are sectional views of an embodiment of an LED formed by the method for manufacturing an LED in the present invention.

Referring FIG. 3, step S12 includes: depositing hard mask material on the interface between the substrate 201 and the LED, and then patterning the hard mask material by photo-etching and etching to form a hard mask 202. Specifically, the hard mask 202 is made from silicon dioxide.

Figure 4:
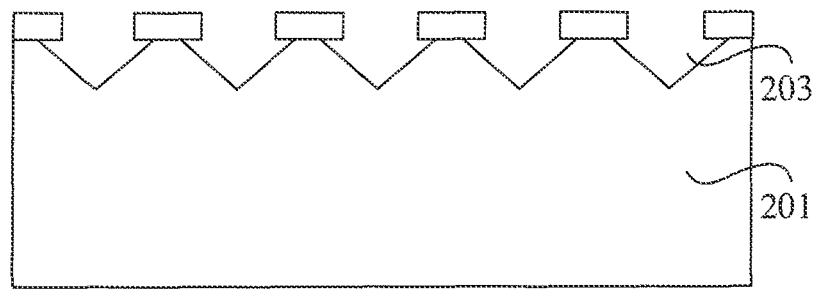

Referring to FIG. 4, step S13 includes: wet etching the substrate 201 using the hard mask 202 as an etching mask; forming a plurality of pyramid-shaped recesses 203 on the regions not covered by the hard mask 202. The pyramid-shaped recesses 203 have a small depth and a big opening. Specifically, the substrate is sapphire, and an anisotropic etching is performed to the sapphire substrate with a mixed solution of sulfuric acid and phosphoric acid.

It should be noted that the solution used in wet etching has a high selection ratio to the substrate 201, to avoid etching the hard mask 202. Specifically, the substrate 201 is a sapphire substrate (aluminum oxide), the hard mask 202 is silicon dioxide, and the substrate 201 is etched with a mixed solution of sulfuric acid and phosphoric acid, which has a small corrosive action upon silicon dioxide.

In step S14, the hard mask 202 is removed with hydrofluoric acid solution, the regions among the pyramid-shaped recesses covered by the hard mask 202 are not etched.

For step S1, preferably, adjacent hard mask patterns in the hard mask 202 have an interval of 0.1~10 μm, and the substrate 201 is etched with an etching depth of 0.1~1.0 μm. Therefore, adjacent pyramid-shaped recesses have an interval of 0.1~10 μm, and the pyramid-shaped recesses 203 have a depth of 0.1~1.0 μm.

Figure 5:
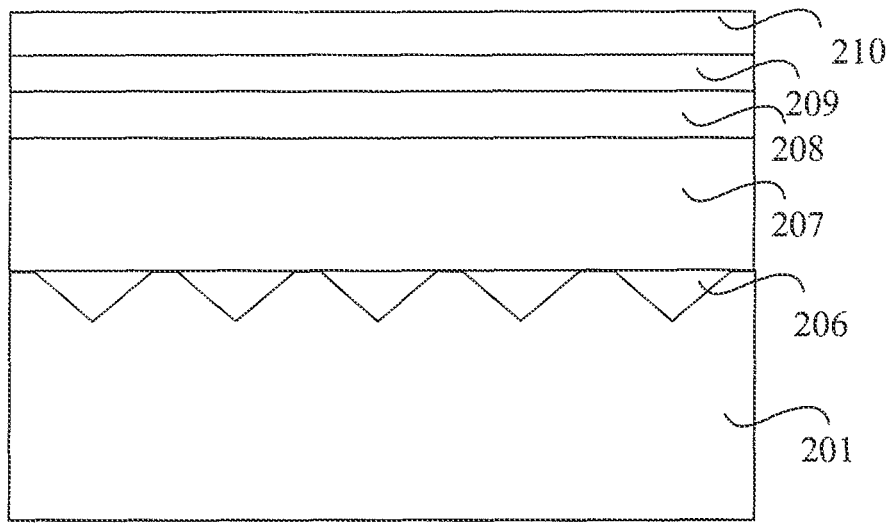
Figure 6:
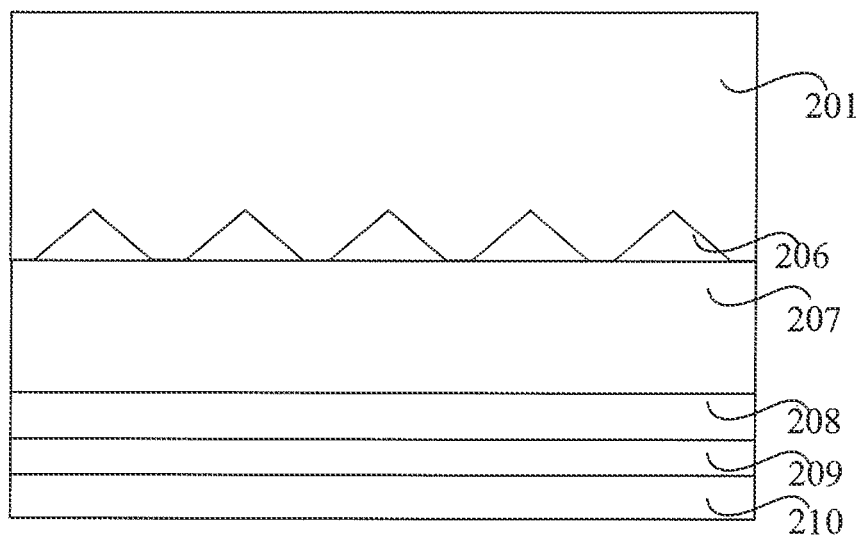

Referring to FIG. 5, in step S2, an n-type semiconductor layer 207, an active layer 208 and a p-type semiconductor layer 209 are formed successively on the substrate 201 by metal-organic chemical vapor deposition (MOCVD), which forms an LED chip including the n-type semiconductor layer 207, the active layer 208 and the p-type semiconductor layer 209. Specifically, the n-type semiconductor layer 207 is made from n-type gallium nitride; the active layer 208 can be a single-quantum well active layer or a multi-quantum well active layer, for example, the active layer 208 is InGaN multi-quantum well active layer; and the material of the p-type semiconductor layer 209 is p-type gallium nitride.

To solve the problem that the substrate has a lattice constant that does not match the n-type semiconductor layer 207, preferably, buffer layer material is deposited on the upper surface of the substrate 201 (or in the pyramid-shaped recesses in the upper surface of the substrate 201) before forming the LED chip on the substrate 201, which forms a buffer layer 206. Specifically, the buffer layer 206 is formed by MOCVD; and the buffer layer 206 is made from aluminium nitride or gallium nitride (GaN).

Still in step S2, second electrode material is deposited on the p-type semiconductor layer 209 by MOCVD, to form a second electrode 210. Specifically, the second electrode 210 is made from nickel or gold.

Figure 7:
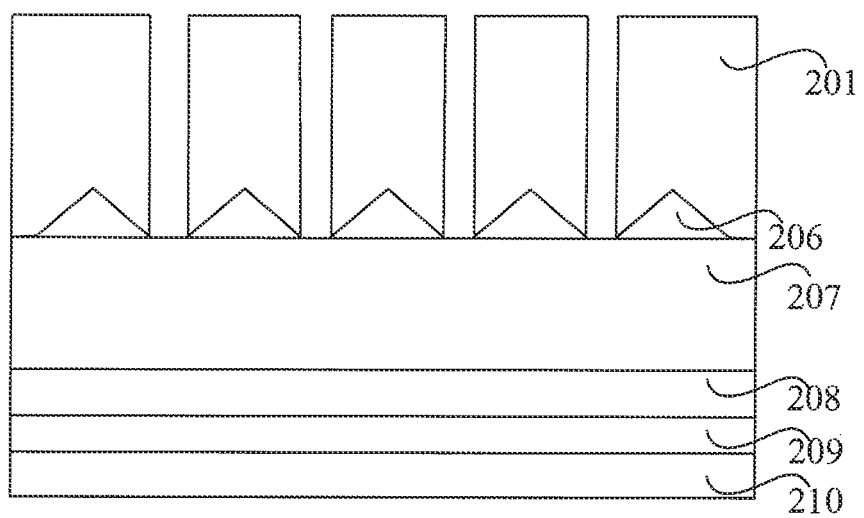

Referring to FIG. 7, step S3 includes: patterning the substrate 201 from the backface of the substrate 201 by photo-etching and etching, to form a plurality of contact holes which extend through the substrate 201 and to the n-type semiconductor layer 207. Specifically, the substrate 201 is etched by dry etching.

It should be noted that the etching process to form pyramid-shaped recesses on the substrate 201 includes two etching steps, which are etching the substrate 201 and etching the buffer layer 206 in the pyramid-shaped recesses.

Preferably, before patterning the substrate 201, a thickness reduction process is performed on the backface of the substrate 201. Specifically, the thickness reduction process is chemical mechanical polishing (CMP). The thickness of the substrate 201 is reduced to 20~50 μm. The thickness reduction process which reduces the thickness of the substrate 201 benefits the later patterning process, and makes it easy to form contact holes with a low depth-to-width ratio which are easy to be filled with conducting material.

Figure 8:
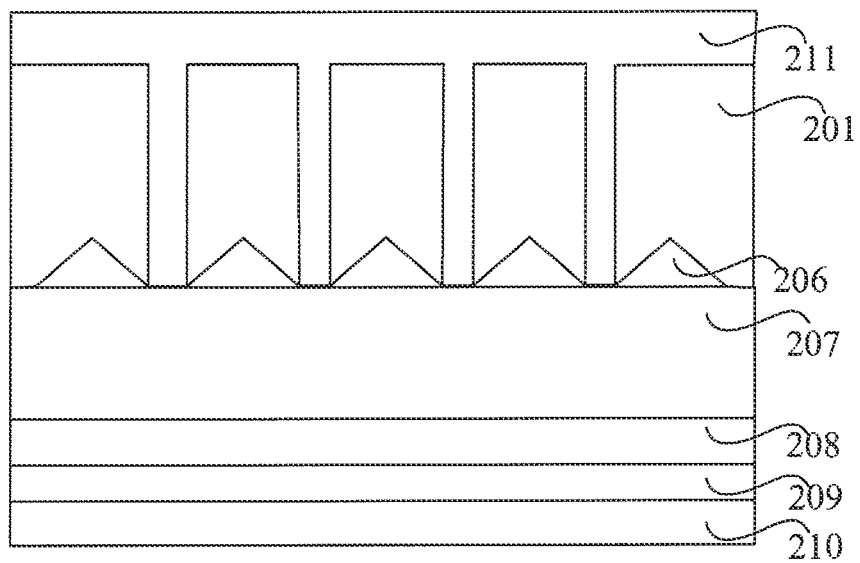

Referring to FIG. 8, in step S4, the contact holes are filled and filled up with conducting material by Physical Vapor Deposition (PVD); and a conducting material layer is formed overlying the backface of the substrate, which forms a first electrode. The conducting material filled in the contact holes forms electrode plugs of the first electrode. The first electrode electrically connects to the n-type semiconductor layer 207 through the electrode plugs. Specifically, the conducting material is conductive metal, such as titanium, aluminum or gold, etc.

The method for manufacturing an LED is finished.

The method for manufacturing a light emitting device which includes an LED further includes steps: providing a base, the base including an assembly groove; and fixing an LED on the bottom of the assembly groove of the base, in a way that the first electrode is connected with the bottom of the assembly groove. The side wall and a bottom of the assembly groove forms an angle of 130°~150°, which side wall reflects light from the LED, thus improving the luminous efficiency of the LED. The base is made from conducting material having good heat dispersion characteristics, such as silicon or aluminium. The dimension of the upper opening of the assembly groove is 4 μm, and the dimension of the bottom opening of the assembly groove is 2 μm.

The method for manufacturing a light emitting device further includes: forming a lens structure covering the second electrode. Preferably, the lens structure is formed covering the second electrode and filling the gap between the LED and the base. The lens structure converges the light emitted from the LED.

The method for manufacturing a light emitting device further includes: coating the lens structure with fluorescent powder, which is used to emit white light. For blue-light LED, the fluorescent powder is YAG fluorescent powder including $Ce^{3+}$, which is used to emit white light.

The method for manufacturing a light emitting device further includes: providing a first lead which connects the base to the negative terminal of a power supply, and providing a second lead which connects the second electrode to the positive terminal of a power supply.

A light emitting device has been manufactured.

The method provided in the present invention is easy to implement.

Although the present invention has been illustrated and described with reference to the preferred embodiments of the present invention, those ordinary skilled in the art shall appreciate that various modifications in form and detail may be made without departing from the spirit and scope of the invention.

The invention claimed is:

1. An LED comprising:
    a first electrode, for connecting the LED to a negative terminal of a power supply;
    a substrate, located on the first electrode;
    an LED chip, located on the substrate;
    a lens structure covering the LED chip; and
    fluorescent powder covering the lens structure; in which
    a plurality of contact holes are formed through the substrate and are evenly distributed, the contact holes being filled with electrode plugs for connecting the first electrode to the LED chip.

2. The LED of claim 1, wherein a plurality of pyramid-shaped recesses are formed on an interface between the substrate and the LED chip.

3. The LED of claim 2, wherein the pyramid-shaped recesses have a depth of 0.1~1.0 μm.

4. The LED of claim 2, wherein adjacent pyramid-shaped recesses have an interval of 0.1~10 μm.

5. The LED of claim 2, wherein the pyramid-shaped recesses are filled with a buffer layer.

6. A light emitting device comprising an LED of claim 1, wherein the light emitting device further comprises a base, on which the LED is mounted.

7. The light emitting device of claim 6, wherein the base includes an assembly groove for mounting the LED, and a side wall of the assembly groove and a bottom of the assembly groove form an angle of 130°~150°.

8. The light emitting device of claim 6, wherein the LED further includes a second electrode located on the LED chip, and the lens structure covers the second electrode, or covers the second electrode and fills a gap between a side wall of the assemble groove and the LED chip.

* * * * *